(12) United States Patent
Saripella

(10) Patent No.: US 6,445,211 B1
(45) Date of Patent: Sep. 3, 2002

(54) CIRCUIT TECHNIQUE FOR IMPROVED CURRENT MATCHING IN CHARGE PUMP PLLS

(75) Inventor: Satish C. Saripella, Starkville, MS (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/716,526

(22) Filed: Nov. 20, 2000

(51) Int. Cl.[7] .......................................... H03K 19/0175
(52) U.S. Cl. .............................. 326/83; 326/33; 326/34
(58) Field of Search ............................... 326/33, 34, 83, 326/88, 92; 327/157, 156, 534, 537, 536, 543, 589

(56) References Cited

U.S. PATENT DOCUMENTS 5,912,575 A * 6/1999 Takikawa ................... 327/157
6,124,741 A * 9/2000 Arcus ........................ 327/112
6,163,187 A * 12/2000 Sano .......................... 327/157

* cited by examiner

Primary Examiner—Michael Tokar
Assistant Examiner—Anh Tran
(74) Attorney, Agent, or Firm—Christopher P. Maiorana, P.C.

(57) ABSTRACT

An apparatus comprising a pullup circuit, a pulldown circuit, and a control circuit. The pullup circuit may be configured to receive a first and second control signal. The pulldown circuit may be configured to receive a third and fourth control signal. The control circuit may be configured to generate the first, second, third and fourth control signals. The control circuit may comprise (i) a first and second control device coupled between the first and second control signals and a supply and (ii) a third and fourth control device coupled between the third and fourth control signals and the supply.

18 Claims, 7 Drawing Sheets

CIRCUIT TECHNIQUE FOR IMPROVED CURRENT MATCHING IN CHARGE PUMP PLLS

FIELD OF THE INVENTION

The present invention relates to a method and/or architecture for current sources generally and, more particularly, to a method and/or architecture matching PMOS and NMOS current sources in charge pumps used in PLLs.

BACKGROUND OF THE INVENTION

Several conventional methods have been implemented to provide current matching between pullup and pulldown sections in charge pump phase lock loop (PLL) circuits. However, most conventional methods have improper matching and a higher output compliance requirement for good matching.

Figure 1A:
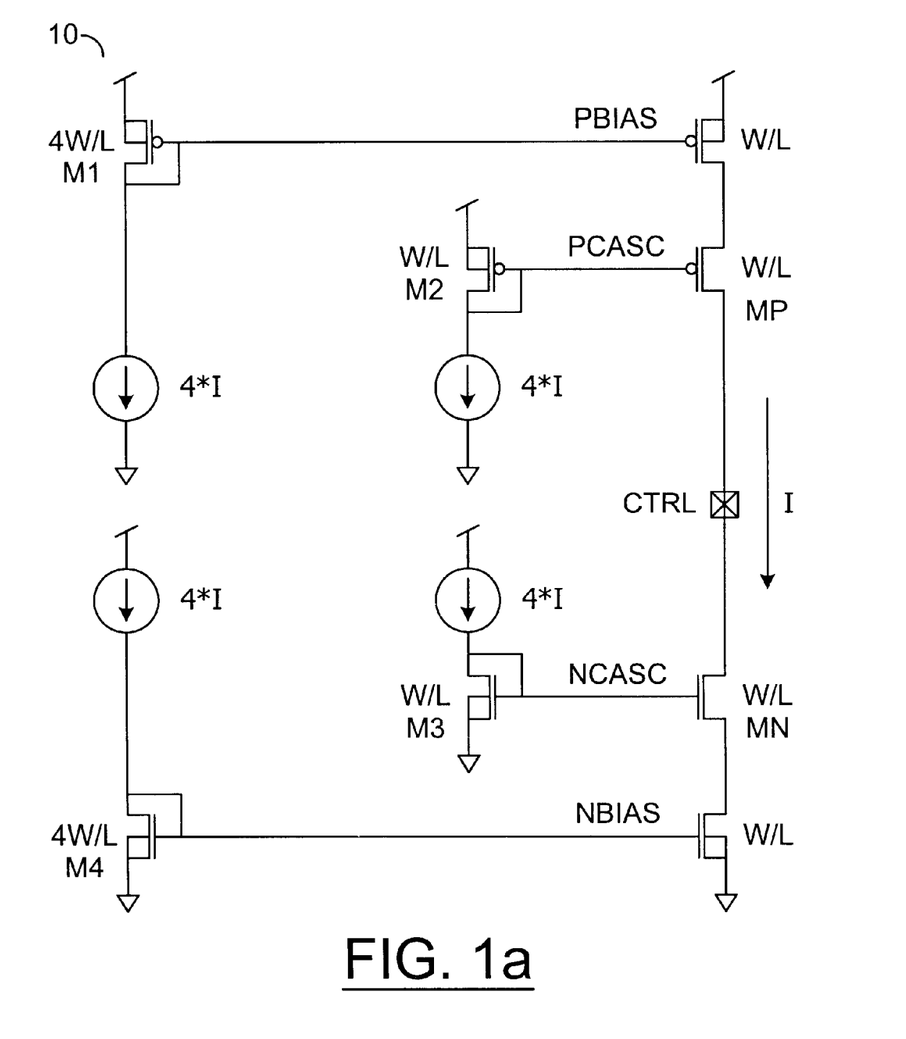
Figure 1B:
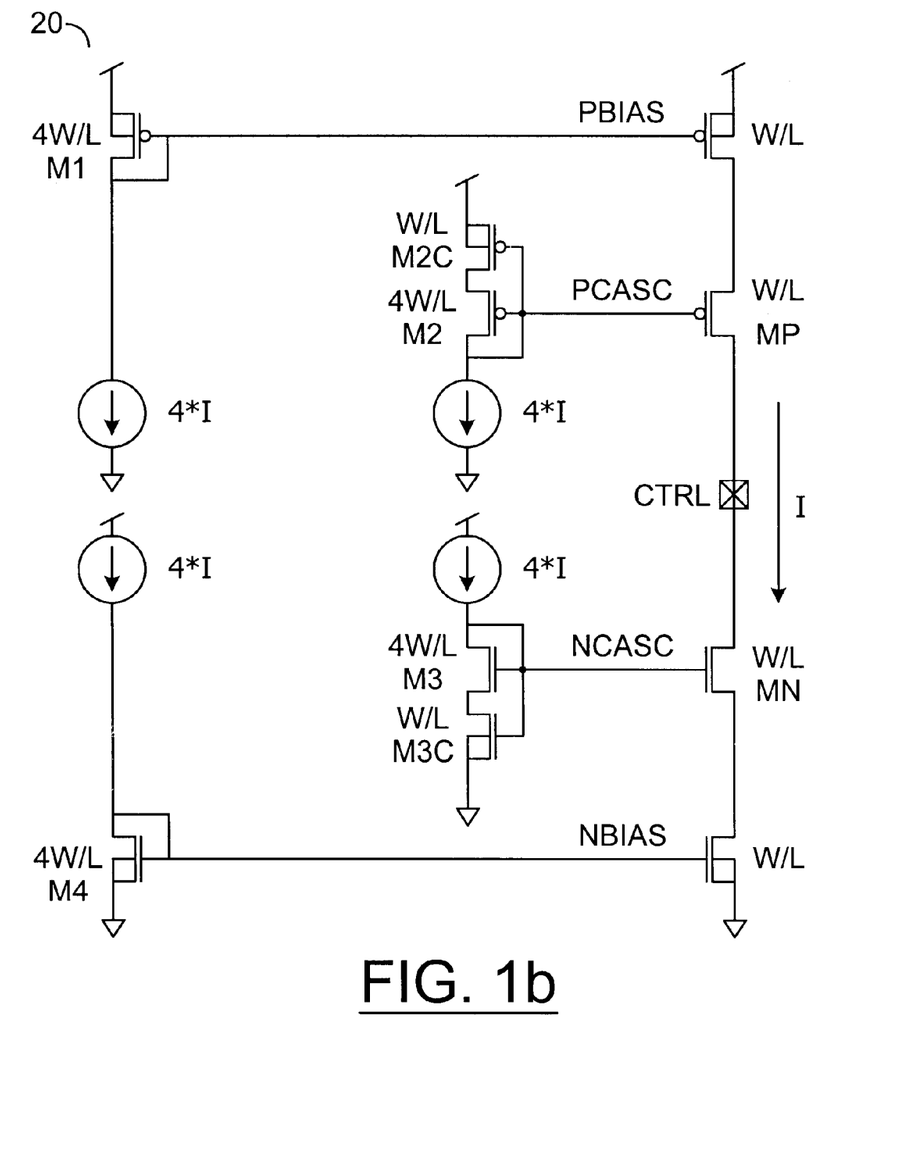
Figure 1C:
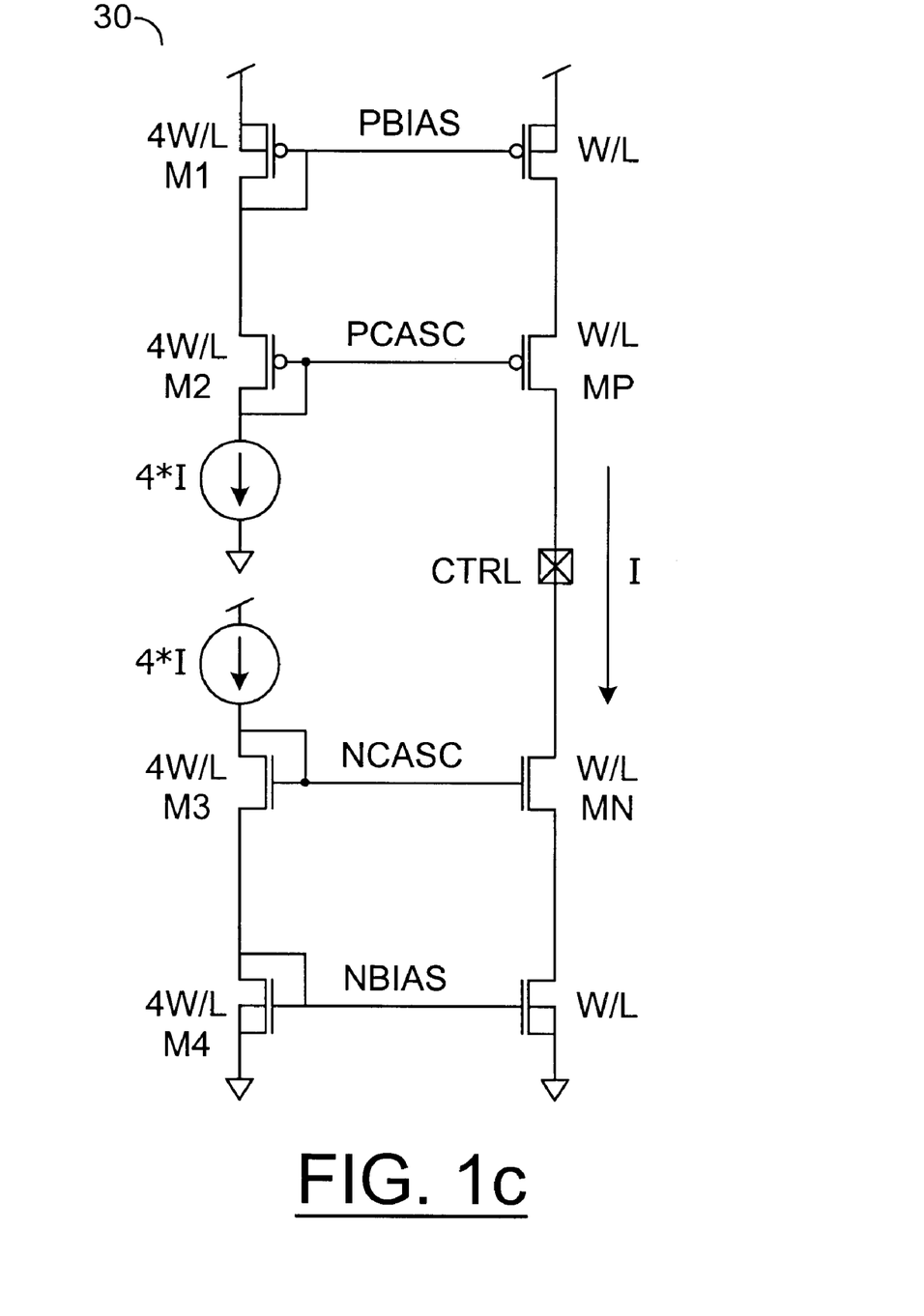
Figure 2A:
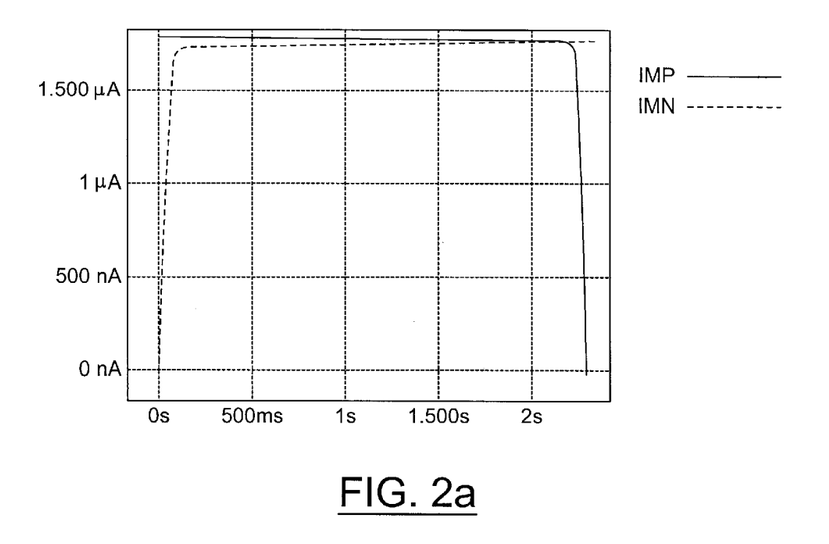
Figure 2B:
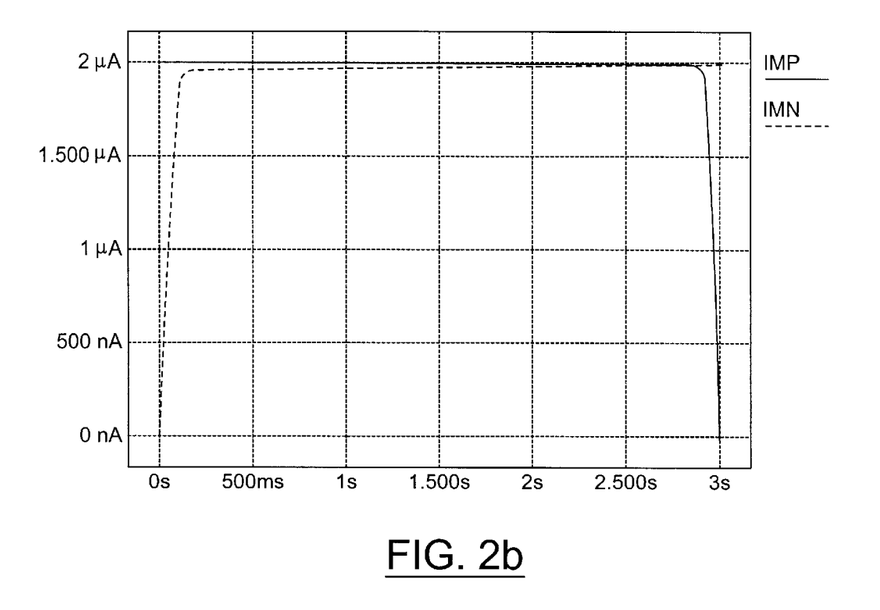
Figure 2C:
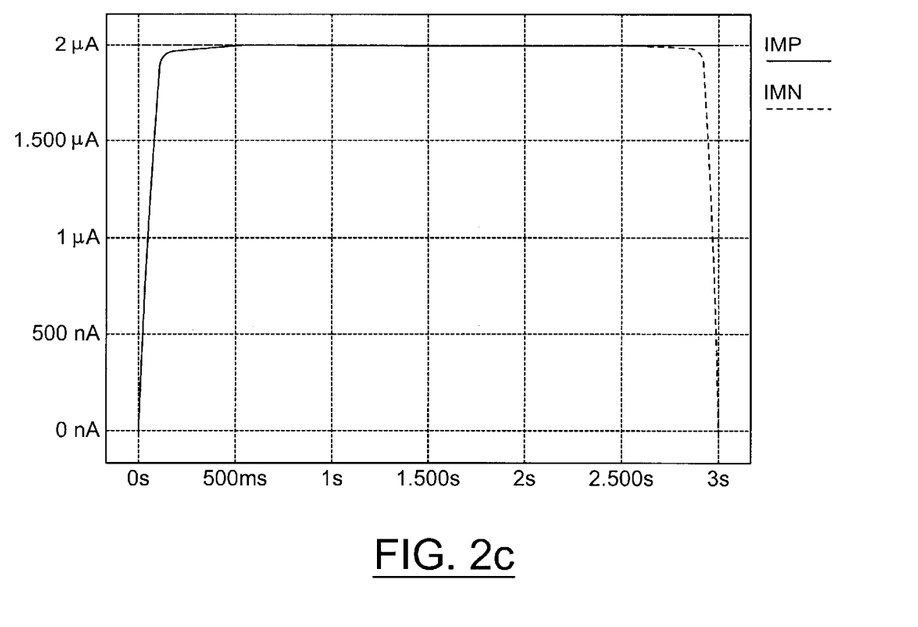

Referring to FIGS. 1(a–c), conventional methods for current generation are shown. FIG. 1a illustrates a circuit 10, FIG. 1b illustrates a circuit 20 and FIG. 1c illustrates a circuit 30. Current matching simulation plots of the circuits 10, 20 and 30 are shown in FIGS. 2(a–c), respectively.

The circuits 10 and 20 are cascode structures that do not provide accurate matching between NMOS and PMOS stacks. In particular, the resistance of the NMOS and PMOS devices that are closest to the supply voltage do not track each other due to differences between NMOS and PMOS devices when they enter saturation. Increasing current through the cascode stage or providing very large size discrimination may obtain better matching. However, the circuits 10 and 20 provide a current source with very low output compliance, particularly if only the NMOS or PMOS source is of interest.

A cascoded output stage provides a large output impedance, which is a general prerequisite for any current reference. One method of generating the cascode voltages PCAS and NCAS and the bias voltages PBIAS and NBIAS is by size discrimination or current discrimination in the two stages. The size discrimination generates unequal bias voltages PBIAS and NBIAS that drive a cascode output stage.

Ideally a constant current (or a multiple) flows through the two stages that generate the bias voltages PBIAS and NBIAS and the cascode voltage PCASC and NCASC. However, a mismatch occurs between the NMOS and PMOS stacks that mirror the cascode and bias voltages. The mismatch can be traced to the devices closest to the supply voltage. The mismatch occurs since the NMOS and PMOS devices can enter saturation at different drain to source voltages (i.e., Vdsnmos does not equal Vdspmos). Therefore, a different output resistance curve is traced by the two references, as shown in FIGS. 2a and 2b.

The circuits 10 and 20 provide an output compliance range in the region of around 200 mV from either supply voltage. The devices closest to supply voltage operate on the edge of their linear limit (i.e., just as they enter saturation) before the negative feedback blocks any further increase in the drain to source voltage Vds. However, different resistance values for the NMOS and PMOS devices may result. Prior solutions have increased the size discrimination or current discrimination or both in the cascode and bias generation legs and obtained reasonable matching. However, such solutions are not best suited with respect to die area and current consumption constraints.

The circuit 30 requires a compliance voltage of a threshold voltage Vtn or (Vcc−Vtp) at the output before a high impedance output is delivered. The circuit 30 eliminates the mismatch associated with the circuits 10 and 20 by operating the devices closest to the supply voltage with a drain to source voltage Vds that is equal to at least a threshold voltage Vt. As Vds>=Vt, the devices are pulled well into the saturation regions to provide matching between NMOS and PMOS output references. However, a disadvantage of the circuit 30 is that the minimum output compliance voltage is equal to one threshold voltage Vt from the supply voltage. Thus, the output compliance voltage is Vtn>Vcompliance<(Vcc−Vtp).

Generally, charge pumps should have a high output impedance in order to maintain a constant current across a range of control voltages used in frequency synthesis. Therefore, single MOS devices biased with a constant gate voltage are unsuitable due to channel length modulation which causes large mismatches between NMOS and PMOS currents. Such current mismatches can cause different phase offsets at different synthesized frequencies. A cascode device structure is usually a good choice to maintain constant current over a wide range of output voltages.

SUMMARY OF THE INVENTION

The present invention concerns an apparatus comprising a pullup circuit, a pulldown circuit, and a control circuit. The pullup circuit may be configured to receive a first and second control signal. The pulldown circuit may be configured to receive a third and fourth control signal. The control circuit may be configured to generate the first, second, third and fourth control signals. The control circuit may comprise (i) a first and second control device coupled between the first and second control signals and a supply and (ii) a third and fourth control device coupled between the third and fourth control signals and the supply.

The objects, features and advantages of the present invention include providing a method and/or architecture for improved current matching in charge pumps that may be used in PLLs that may (i) improve current matching in NMOS and PMOS output stages, (ii) improve a specification margin for static phase offset in single ended charge pump implementations, (iii) have a lower output compliance compared to an otherwise equivalent-performing scheme, (iv) have matching between P and N stacks, (vi) provide less than 1% mismatch within the operating range, (vi) allow tracking between reference and mirror devices and/or (vii) allow compliance limits on an output voltage that are less than Vtn or (Vcc−Vtp).

BRIEF DESCRIPTION OF THE DRAWINGS

These and other objects, features and advantages of the present invention will be apparent from the following detailed description and the appended claims and drawings in which:

FIGS. 1(a–c) are diagrams of conventional current matching circuits;

FIGS. 2(a–c) are simulation graphs illustrating results of the conventional circuits for current matching;

DETAILED DESCRIPTION OF THE PREFERRED EMBODIMENTS

Figure 3:
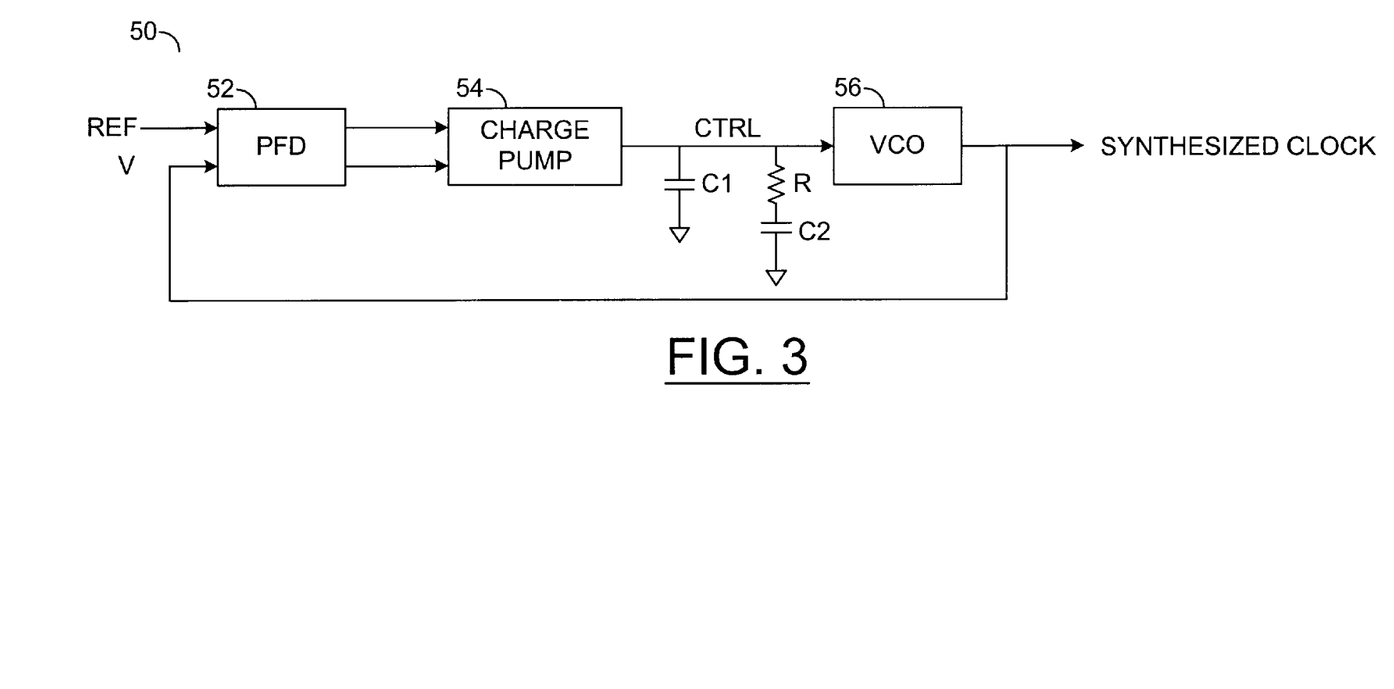
FIG. 3 is a block diagram illustrating a context for implementing the present invention.

Referring to FIG. 3, a block diagram of a circuit 50 illustrating a preferred embodiment of the present invention implemented in the context of a phase lock loop circuit is shown. The circuit 50 generally comprises a phase frequency detector (PFD) 52, a charge pump 54, and a voltage controlled oscillator (VCO) 56. A capacitor C1, a capacitor C2 and a resistor R may be used to filter the signal (e.g., CTRL) presented to the VCO 56 by the charge pump 54. The present invention may be implemented within the charge pump 54.

Phase lock loop circuits (PLLs) may be designed to meet skew specifications between an input reference clock signal (e.g., REF) and a generated feedback clock signal (e.g., V). Ideally, a zero skew is desired in order to meet a similar setup and hold timing requirement either with or without a PLL. However, a static phase offset between the reference clock signal REF and the feedback clock signal V may result from (i) mismatches in the PFD 52 and (ii) current mismatches coupled with transient response differences between NMOS and PMOS devices within the charge pump 54. The present invention may reduce the mismatch between PMOS and NMOS currents in the charge pump 54.

Figure 4:
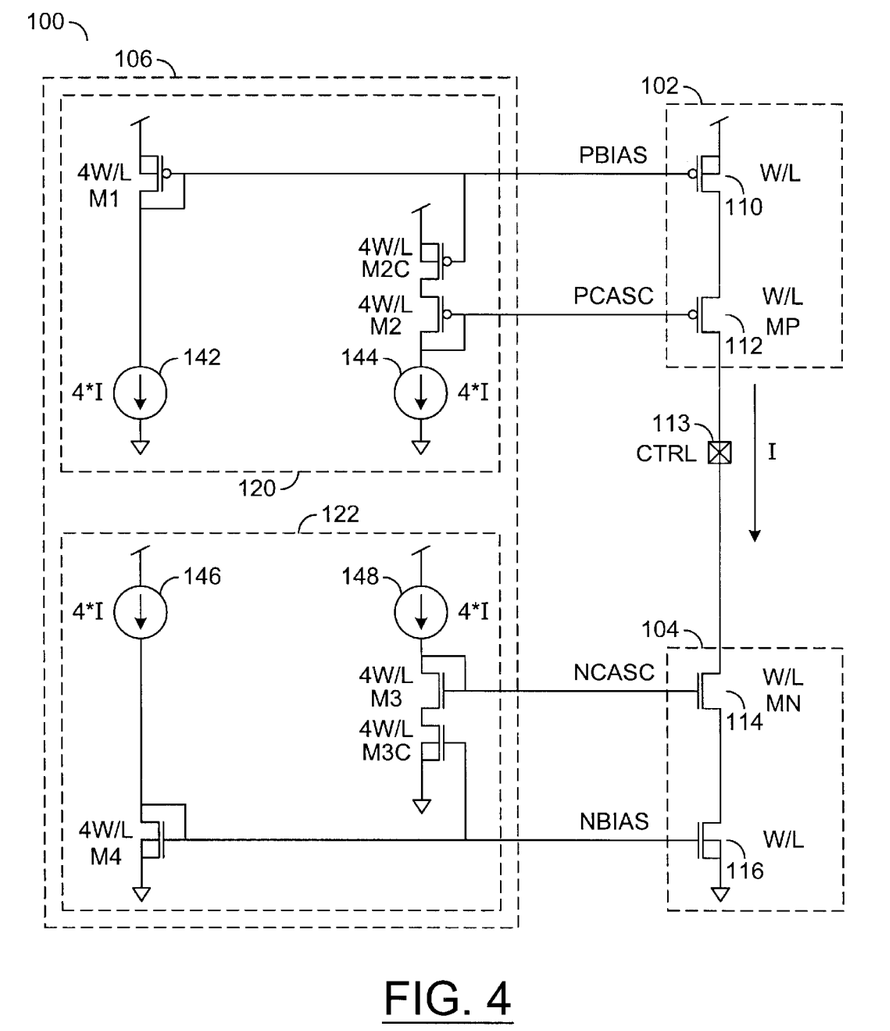
FIG. 4 is a diagram of a preferred embodiment of the present invention.

Referring to FIG. 4, a schematic diagram of a circuit 100 is shown in accordance with a preferred embodiment of the present invention. The circuit 100 generally comprises a pullup block (or circuit) 102, a pulldown block (or circuit) 104, and a control block (or circuit) 106. The circuit 102 may be implemented as a pullup stack. The circuit 102 generally pulls the signal CRTL towards a power supply voltage in response to a bias signal or voltage (e.g., PBIAS) and a cascode signal or voltage (e.g., PCASC). The circuit 104 may be implemented as a pulldown stack. The circuit 104 generally pulls the signal CRTL towards a power supply ground in response to a bias signal or voltage (e.g., NBIAS) and a cascode signal or voltage (e.g., NCASC). A current (e.g., I) generally flows between the circuits 102 and 104 through a connection to a pad 113. The circuit 106 may be configured to generate the signals PBIAS, PCASC, NBIAS, and NCASC.

The pullup circuit 102 generally comprises a transistor 110 and a transistor 112. The transistors 110 and 112 may be implemented as one or more PMOS transistors. However, other types and polarity transistors may be implemented to meet the design criteria of a particular application. A gate of the transistor 110 generally receives the bias signal PBIAS. A source of the transistor 110 may be connected to the supply voltage. A drain of the transistor 110 may be connected to a source of the transistor 112. A gate of the transistor 112 generally receives the cascode signal PCASC. A drain of the transistor 112 may be connected to the pad 113.

The pulldown circuit 104 generally comprises a transistor 114 and a transistor 116. The transistors 114 and 116 may be implemented as one or more NMOS transistors. However, other types and polarity transistors may be implemented to meet the design criteria of a particular application. A drain of the transistor 114 may be connected to the pad 113. A gate of the transistor 114 generally receives the cascode signal NCASC. A source of the transistor 114 may be connected to a drain of the transistor 116. A gate of the transistor 116 generally receives the bias signal NBIAS. A source of the transistor 116 may be connected to the voltage supply ground.

The control circuit 106 generally comprises a control circuit 120 and a control circuit 122. The control circuit 120 generally controls the pullup circuit 102 by generating the signals PBIAS and PCASC. The control circuit 122 generally controls the pulldown circuit 104 by generating the signals NCASC and NBIAS. The control circuit 120 generally comprises a transistor M1, a transistor M2, and a transistor M2C. The transistors M1, M2, and M2C may be implemented as one or more PMOS transistors. However, other types and polarity transistors may be implemented to meet the design criteria of a particular application. The transistor M1 generally creates a current path 142 to ground. A source of the transistor M1 may be connected to the supply voltage. A drain and a gate of the transistor M1 may be connected to a first terminal of a current source 142. A second terminal of the current source 142 may be connected to a power supply ground. The signal PBIAS may be presented at the gate of the transistor M1.

The transistors M2C and M2 generally create a current path 144 to ground. A source of the transistor M2C may be connected to the supply voltage. A gate of the transistor M2C may receive the signal PBIAS. A drain of the transistor M2C may be connected to a source of the transistor M2. A gate and a drain of the transistor M2 may be connected to a first terminal of a current source 144. A second terminal of the current source 144 may be connect to the power supply ground. The signal PCASC may be presented at the gate of the transistor M2.

The control circuit 122 generally comprises a transistor M3, a transistor M3C and a transistor M4. The transistors M3, M3C, and M4 may be implemented as one or more NMOS transistors. However, other types and polarity transistors may be implemented to meet the design criteria of a particular application. The transistor M3 may also be configured as a diode. The transistor M4 generally creates a current path 146 from a supply voltage. A source of the transistor M4 may be connected to the voltage supply ground. A drain and a gate of the transistor M4 may be connected to a first terminal of a current source 146. A second terminal of the current source 146 may be connected to a power supply voltage. The signal NBIAS may be presented at the gate of the transistor M4.

The transistors M3 and M3C generally create a current path 148 from a supply voltage. A source of the transistor M3C may be connected to the power supply ground. A gate of the transistor M3C may receive the signal NBIAS. A drain of the transistor M3C may be connected to a source of the transistor M3. A gate and a drain of the transistor M3 may be connected to a first terminal of a current source 148. A second terminal of the current source 148 may be connect to the power supply voltage. The signal PCASC may be presented at the gate of the transistor M3.

The transistors M1, M2, M2C, M3, M3C, and M4 may have a channel width to length ratio (e.g., W/L) that may be four times the W/L of the transistors 110, 112, 114, and 116. The current paths 142, 144, 146, and 148 may pass, in one example, four times as much current as flows between the circuits 102 and 104.

The circuit 100 may be implemented with compliance less than a threshold voltage Vt from the supply rail and may provide matching similar to the circuit 30 of FIG. 1C. When considering the pulldown section 114 of the circuit 100 of FIG. 4, the signal NBIAS may be generated using conventional methods. By mirroring the signal NBIAS onto the cascode device M3C (which has a current that is generally sourced by the transistor M3) matching similar to the circuit 30 can be obtained, but without the associated drawbacks (e.g., threshold voltage constraints, etc.). The transistor M3C does not develop a full voltage threshold Vtn of the drain to source voltage Vds to saturate. The transistor M3C requires less than a threshold voltage Vtn to saturate. As the saturation voltage Vdsat (which is generally less than the threshold voltage Vtn) is mirrored on the output stack of circuit 104, the compliance requirements on node 113 are reduced. Furthermore, the compliance of the pullup stack 102 is also reduced. Since the transistors M2C and M3C are pulled away from soft saturation transistors 116 and 110, the transistors 110 and 112 generally mirror the same effect and track with less mismatch.

Figure 5:
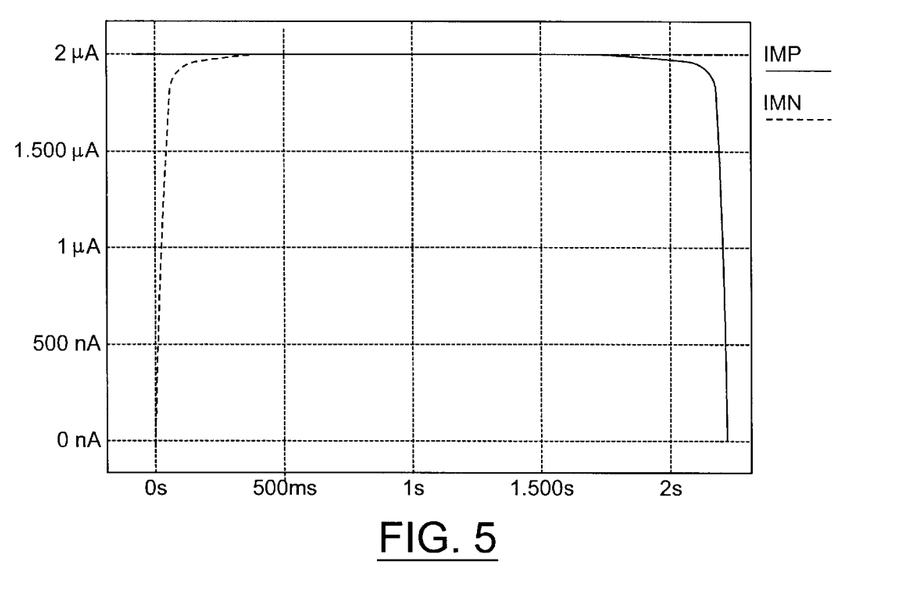
FIG. 5 is a simulation plot illustrating an operation of the present invention.

Referring to FIG. 5, a simulation plot illustrating example waveforms of the present invention is shown. Resistance curves traced by the NMOS and PMOS output stages illustrate the current matching that the present invention may provide.

The circuit 100 may improve the matching between PMOS and NMOS current sources used in charge pump PLLS. Accurate matching is generally desired in order to reduce the static phase offset of the PLL generated clock. The circuit 100 may improve the compliance range, since the minimum compliance required is generally less than a threshold voltage Vt from the supply voltage. In particular, the circuit 100 may be useful in low voltage environments (e.g., supply voltages of 2.7 v, 1.8 v, or even lower). The devices of the control circuit 106 generally need not have a threshold voltage Vt equal to a drain to source voltage Vds to enter saturation. A value less than a threshold voltage Vt may cause saturation. The biasing allows a compliance less than the threshold voltage Vt from either power supply.

The circuit 100 provides improved matching in the NMOS and PMOS output stages (102 and 104) that ultimately improves margin to the specification of static phase offset in single ended charge pump implementations.

The circuit 100 may provide lower output compliance compared to an equivalent-performing scheme. The circuit 100 may also provide accurate matching between PMOS and NMOS stacks. Additionally, the circuit 100 may also provide less than 1% mismatch within the operating range. The circuit 100 may also provide accurate tracking between the reference device and mirror. The circuit 100 may also provide less than Vtn or (Vcc−Vtp) compliance limits on output voltage. The circuit 100 may also provide a current reference scheme suited for charge pump PLLs. The circuit 100 may also provide a constant current source with relatively low output compliance.

The present invention may have particular value based on design requirements. In particular, if low voltage operability and matching are desired, the present invention may be useful.

While the invention has been particularly shown and described with reference to the preferred embodiments thereof, it will be understood by those skilled in the art that various changes in form and details may be made without departing from the spirit and scope of the invention.

What is claimed is:

1. An apparatus comprises:
   a pullup circuit configured to receive a first and second control signal;
   a pulldown circuit configured to receive a third and fourth control signal; and
   a control circuit configured to generate said first, second, third and fourth control signals, wherein said control circuit comprises (i) a first control device configured to generate said first control signal in response to a supply voltage, (ii) a second control device configured to generate said second control signal in response to said first control signal and said supply voltage, (iii) a third control device configured to generate said third control signal in response to said supply voltage and (iv) a fourth control device configured to generate said fourth control signal in response to said third control signal and said supply voltage.

2. The apparatus according to claim 1, wherein said apparatus is configured to provide current matching between said pullup circuit and said pulldown circuit.

3. The apparatus according to claim 1, wherein said apparatus is configured to provide accurate tracking between a reference device and a mirror device.

4. The apparatus according to claim 1, wherein said apparatus is configured to provide low output voltage compliance.

5. The apparatus according to claim 1, wherein said apparatus comprises a current reference circuit.

6. The apparatus according to claim 1, wherein said apparatus is configured to provide a constant current source.

7. The apparatus according to claim 1, wherein said apparatus is implemented within a charge pump of a phase lock loop (PLL).

8. The apparatus according to claim 1, wherein said apparatus is configured to improve a static phase offset specification in a single ended charge pump.

9. The apparatus according to claim 1, wherein:
   said first and second control devices comprise one or more PMOS devices; and
   said third and fourth control devices comprise one or more NMOS devices.

10. The apparatus according to claim 1, wherein said first control signal comprises a bias signal.

11. The apparatus according to claim 10, wherein said third control signal comprises a bias signal.

12. The apparatus according to claim 1, wherein:
   said first and second control devices comprise one or more PMOS transistors that are equally sized; and
   said third and fourth control devices comprise one or more NMOS transistors that are equally sized.

13. An apparatus comprises:
   a pullup circuit configured to receive a first and second control signal;
   a pulldown circuit configured to receive a third and fourth control signal; and
   means for generating said first, second, third and fourth control signals, wherein said generating means comprises (i) a first control device configured to generate said first control signal in response to a supply voltage, (ii) a second control device configured to generate said second control signal in response to said first control signal and said supply voltage, (iii) a third control device configured to generate said third control signal in response to said supply voltage and (iv) a fourth control device configured to generate said fourth control signal in response to said third control signal and said supply voltage.

14. A method for generating a constant current comprising the steps of:
   (A) sourcing a current in response to a first and second control signal;
   (B) sinking a current in response to a third and fourth control signal;
   (C) generating (i) said first control signal in response to a supply voltage and (ii) said second control signal in response to said first control signal and said supply voltage; and
   (D) generating (i) said third control signal in response to said supply voltage and (ii) said fourth control signal in response to said third control signal and said supply voltage.

15. The apparatus according to claim 12, wherein said control devices are sized larger than devices of said pullup circuit and said pulldown circuit.

16. The apparatus according to claim 15, wherein said control devices have a channel width-to-length ratio that is four times a channel width-to-length ratio of said devices of said pullup and pulldown circuits.

17. The apparatus according to claim 1, wherein said second control device comprises:

- a first transistor configured to receive said supply voltage at a first terminal and said first control signal at a second terminal; and
- a second transistor having a first terminal connected to a third terminal of said first transistor and a second and third terminal connected together and configured to present said second control signal.

18. The apparatus according to claim 1, wherein said third control device comprises:

- a first transistor configured to receive said supply voltage at a first terminal and said third control signal at a second terminal; and
- a second transistor having a first terminal connected to a third terminal of said first transistor and a second and third terminal connected together and configured to present said fourth control signal.

* * * * *